United States Patent [19]

Shay

[11] 4,420,541

[45] Dec. 13, 1983

[54] RADIATION POLYMERIZABLE COMPOUNDS AND CONDUCTIVE COATINGS FROM SAME

[75] Inventor: Gregory D. Shay, Oak Forrest, Ill.

[73] Assignee: The Sherwin-Williams Company, Cleveland, Ohio

[21] Appl. No.: 313,876

[22] Filed: Oct. 22, 1981

Related U.S. Application Data

[62] Division of Ser. No. 217,873, Dec. 18, 1980, Pat. No. 4,322,331.

[51] Int. Cl.³ .............................................. B32B 27/32
[52] U.S. Cl. ..................................... 428/523; 427/44; 427/53.1; 427/54.1; 526/292.2; 526/292.95; 204/159.22
[58] Field of Search ................. 428/523; 427/44, 53.1, 427/54.1; 524/815; 526/300, 307, 312, 292.2, 292.95

[56] References Cited

U.S. PATENT DOCUMENTS

| | | | |
|---|---|---|---|
| 2,469,683 | 5/1949 | Dudley et al. | 521/25 |
| 2,567,836 | 9/1951 | Anthes | 260/89.7 |
| 3,486,932 | 12/1969 | Schaper | 117/201 |
| 4,097,417 | 6/1978 | Pastor | 252/501 |
| 4,112,207 | 9/1978 | Jones | 526/17 |

*Primary Examiner*—Joseph L. Schofer
*Assistant Examiner*—Bernard Lipman
*Attorney, Agent, or Firm*—Robert E. McDonald; James V. Tura

[57] ABSTRACT

This invention is directed to a novel water soluble conductive material which is capable of being polymerized by actinic radiation. More specifically, this invention involves the use of a radiation curable quaternary ammonium salt obtained by mixing at least one tertiary amine having acryloyl or methacryloyl unsaturation and at least one halide. When the water-soluble conductive material is subjected to actinic radiation sufficient to cause polymerization, it maintains its conductive character, but becomes essentially impervious to attack by water or solvent, and remains tack-free even at high relative humidity. When the water-soluble conductive material is polymerized by actinic radiation, it is not necessary to drive water off during cure and then rehumidify to obtain proper conductivity as is often necessary with the prior art coatings.

5 Claims, No Drawings

RADIATION POLYMERIZABLE COMPOUNDS AND CONDUCTIVE COATINGS FROM SAME

This is a division, of application Ser. No. 217,873, filed Dec. 18, 1980, now U.S. Pat. No. 4,322,331.

FIELD OF THE INVENTION

This invention is directed to a novel water soluble conductive quaternary ammonium salt capable of being polymerized by actinic radiation and to a process for coating a substrate with same.

BACKGROUND

Conductive coatings are useful in a number of areas such as antistatic coatings, shielding applications, photo-imagable coatings and in photocopying applications. Although a number of conductive coatings are known in the prior art, there are limitations associated with their use.

One commercial type of conductive coating involves the use of high molecular weight, solvent-borne coatings which are not subsequently cured. Although these systems have good conductive characteristics, they are still subject to attack by solvent. For instance, if these coatings are used in a photo-imagable application, the electroconductive layer is typically topcoated with a dielectric layer. When both the dielectric and the conductive layer are coated from the same type of solvent, it is difficult to prevent the extraction of at least a small amount of the conductive material into the dielectric material thereby decreasing its effectiveness.

Radiation curable conductive materials are known in the art but these also have certain limitations. Prior to application, these coatings typically require the addition of free acrylic monomers for viscosity reduction. This is especially true when the polymer itself is an acrylic which has been prepared by free radical polymerization. The diluent acrylic monomers are often volatile and may contribute a toxicity hazard to the handling of the materials.

Many of the water-reducible coatings available in the prior art are relatively high in molecular weight and, therefore, must be reduced to less than about 50% solids for application. The excess water remaining in the coating must be driven off by heating, thereby using additional energy.

These problems are overcome in the present invention by using a water soluble, low molecular weight quaternary ammonium salt, which can be polymerized by subjecting it to actinic radiation. Since the product of this invention is a low molecular weight, water-soluble salt, low application viscosities can be achieved at high solids without the use of acrylic monomers and by using water as the only solvent. Once the salt of this invention has been cured by heat or actinic radiation, it is essentially impervious to attack by water or organic solvents.

SUMMARY

It is an object of this invention to provide a polymerizable, water-soluble quanternary ammonium salt. It is a further object of this invention to provide a crosslinked conductive coating by subjecting a novel water-soluble quaternary ammonium salt to heat or actinic radiation sufficient to polymerize the salt through its unsaturation. It is a further object of this invention to provide a radiation polymerizable quaternary ammonium salt which can be applied at high solids using water as the only solvent. It is a further object of this invention to provide a radiation polymerizable conductive material which can be polymerized by ultraviolet or electron beam actinic radiation without the use of added sensitizers or reaction promoters. It is a further object of this invention to provide a radiation curable product which does not require the addition of acrylic monomers for viscosity control.

These and other objects of this invention will be apparent from the following description.

DESCRIPTION OF THE PREFERRED EMBODIMENTS

This invention teaches a novel composition of matter and a process for treating a substrate with a conductive coating. The invention taught herein involves a radiation crosslinkable coating which comprises an aqueous solution of a quaternary ammonium salt wherein the salt is obtained by mixing reactive amounts of: (a) at least one tertiary amine of the formula:

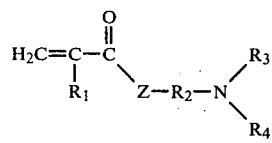

wherein $R_1$ is H or $CH_3$, Z is O or NH, $R_2$ is an aliphatic radical of from 1 to 6 carbon atoms or aryl of from 6 to 10 carbon atoms, $R_3$ and $R_4$ are the same or different and are selected from the group of aliphatic radicals containing from 1 to 10 carbon atoms and aryl radicals containing 6 to 10 carbon atoms; and (b) at least one halide having from 2 to 6 halogen atoms and selected from the group consisting of aliphatic halides having from 1 to 10 carbon atoms and arene halides having from 7 to 20 carbon atoms.

For purposes of this disclosure, the term reactive amounts means between about 0.8 to 1.5 equivalents of the tertiary amine is available for each equivalent of halogen. It is especially preferred that about one equivalent of tertiary amine be available for each equivalent of halogen. When an excess of equivalents of either the amine or the halide is used to drive the reaction to completion, the excess unreacted material is easily separated out because it is not as water soluble as the quaternary ammonium salt product. Typically, unreacted materials can be readily removed based upon this difference in solubility.

Upon mixing, the reaction between the tertiary amine and the halide is very thermodynamically favorable and it rapidly exotherms. Therefore, it is generally preferred to add one of the reactants very slowly to the other with constant stirring while maintaining the reaction at temperatures between about 20° to 100° C. Typical reaction times for producing significant amounts of the desired salt, range from about five minutes up to several hours depending on the reaction temperature and the reactivity of the components.

A representative example of the reaction taught herein (using 2 moles of 2-(N,N-dimethylamino)ethylacrylate and 1 mole of 1,4-dichlorobutane for illustrative purposes) would be:

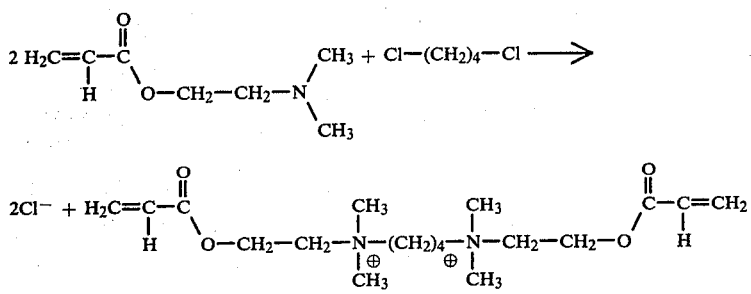

Since one of the major advantages of this invention is the ability to apply the aqueous solution of the salt at very high solids, it is desirable to keep the molecular weight of the salt, and, therefore, the viscosity of its aqueous solution, as low as possible. Therefore, it is sometimes advisable to minimize any possibility of polymerization through the double bonds during the course of the manufacture of the quaternary ammonium salt by using techniques well known in the art to minimize free radical polymerization, e.g. by shielding the reaction vessel from light, by passing a stream of oxygen through the reaction mixture or by the use of stabilizers such as hydroquinone and the like.

The quaternary ammonium salts produced by this invention have a molecular weight less than about 5000 and preferably have a molecular weight less than about 1000 and most preferably have a molecular weight less than about 500.

For ease of handling, it is preferred that the tertiary amine and the halide be mixed in the presence of water so that the salt will be solubilized as soon as it is produced. The exact amount of water used in the aqueous coating of this invention is not critical as long as there is sufficient water to solubilize the salt. However, it is more economically favorable to apply the coating at high solids, therefore, it is preferred that the final coating contain not more than about 50% by weight water and it is especially preferred that the coating contain not more than about 25% water. Since the quaternary ammonium salts produced by this invention are low molecular weight molecules, low application viscosities, e.g. typically less than 500 centipoise, are common for these salts even as a 75% solution in water.

The tertiary amines which are useful in the practice of this invention are those which have acryloyl or methacryloyl unsaturation thereby providing the sites for polymerization when the salt is subjected to actinic radiation. Representative examples of useful tertiary amines include the acrylates, such as 2-(N,N-dimethylamino)ethylacrylate, 2-(N,N-diethylamino)ethylacrylate, 2-(N,N-dimethylamino)propylacrylate and the like; the methacrylates such as 2-(N,N-dimethylamino)ethylmethacrylate, 2-(N,N-diethylamino)ethylmethacrylate and the like; and the acrylamides, such as 2-(N,N-diethylamino)ethylacrylamide and 2-(N,N-dimethylamino)ethylmethacrylamide and the like.

The halides which are useful in the practice of this invention are those which readily undergo nucleophilic substitution reactions. Especially preferred in the practice of this invention are primary halides because they are the most reactive with tertiary amines.

Representative examples of the preferred halides include unsaturated molecules such as 1,4-dichloro-2-butene, 1,6-dichloro-3-hexene and the like; saturated molecules such as 1,2-dichloroethane, 1,3-dichloropropane, 1-bromo-3-chloropropane, 1,4-dibromobutane, 1,4-dichlorobutane and the like; and arene halides such as orthoxylylene chloride and the like. As used herein, the term arene halide means those molecules having halogen functional aliphatic groups as substituents on an aromatic ring.

It is believed that under proper reaction conditions, similar materials to those taught in this invention could be prepared by using an acryloyl or methacryloyl functional halide, such as 2-chloro ethylacrylate, along with a tertiary amine which could also contain acryloyl or methacryloyl unsaturation.

The quaternary ammonium salt prepared within the teaching of this invention should contain an average of at least one and preferably at least two acryloyl or methacryloyl sites per molecute to provide adequate reaction sites for crosslinking and cure of the coating when it is subjected to actinic radiation.

Various pigments and additives well known in the art could also be used in conjunction with the radiation curable material taught in this invention. For instance, if used as photo-imagable coatings there can be used in conjunction therewith conventional pigments and dyes. If the material of this invention is used in a shielding application, metallic powders such as silver or copper could be incorporated therein. If desired, the compositions taught in this invention could also be rendered curable by heat as well as by radiation by incorporating peroxides, azo-catalysts or other heat-activated free radical initiators. Other water-soluble resins such as polyesters, acrylics, epoxies and the like could also be incorporated in order to adjust the properties of the final product.

Although it is possible to polymerize the quaternary ammonium salts taught in this invention by subjecting them to heat in the presence of heat-sensitive free radical initiators, the preferred method of cure is by subjecting the unsaturated salts to actinic radiation for a period of time sufficient to accomplish the desired amount of free radical polymerization. Especially useful in the practice of this invention is actinic radiation having a wavelength less than about 4,000 Angstroms such as ultraviolet light or electron beam radiation. Useful doses of ultraviolet radiation range from about 5 to about 150 feet/minute/lamp while useful doses of electron beam radiation range from about 0.5 to about 15 megarads. The materials of this invention show such rapid polymerization when subjected to actinic radiation that it is generally not necessary to incorporate a special snesitizer or initiator into the formulation.

Any substrate which would provide suitable adhesion when used in combination with the radiation curable quaternary ammonium salt of this invention could be treated with the aqueous coating of the salt to impart conductive characteristics. Useful substrates include, for example, paper, cloth, synthetic fibers, paperboard, wood, rubber, metal, glass and plastic films.

The quaternary ammonium salts taught in this invention can be applied by any of the conventional means known in the art. These application methods include spray, reverse roll, gravure, air knife, knife coater, trailing blade, curtain coater, etc. The exact coating weight which is applied will depend upon the end use, the substrate itself, the curing technique and the end use of the polymerized product.

The following examples are presented for the purpose of illustrating the invention and are not to be construed as limiting its scope.

EXAMPLE 1

A 250 milliliter erlenmeyer flask equipped with a stirring bar was charged with 82.39 grams (0.482 moles) 2-(N,N-diethylamino)ethylacrylate and 37.51 grams deionized water. As the solution was stirred, 30.11 grams (0.241 moles) 1,4-dichloro-2-butene was added to the flask by dropping funnel over a period of 40 minutes. The reactants were stirred and heated to about 160° F. over a period of about three hours. The product was placed into a separatory funnel where it separated cleanly into two clear layers. The small upper phase was identified by infrared analysis as unreacted 2-(N,N-diethylamino)ethylacrylate. The much larger lower viscous phase was the desired quaternary ammonium salt as a 75% solution in water.

EXAMPLE 2

A flask equipped as in Example 1 was charged with 72.56 grams (0.507 moles of 2-(N,N-dimethylamino)ethylacrylate and 37.50 grams of deionized water. To this was added, by dropping funnel, 39.94 grams (0.254 moles) of 1-bromo-3-chloropropane over about a 90 minute period. The mixture was stirred and gradually heated to about 185° F. over a period of two hours and twenty minutes. The reaction mixture was transferred to a separatory funnel and the mixture cleanly separated into a large viscous light yellow upper layer and a very small lower clear layer. Infrared analyses indicated the viscous portion was the desired aqueous solution of the ammonium salt and the colorless lower layer was a reaction product of 2-(N,N-dimethylamino)ethylacrylate.

EXAMPLE 3

A flask such as that in Example 1 was charged with 87.1 grams (0.609 moles) 2-(N,N-dimethylamino)ethylacrylate and 37.5 grams deionized water. By dropping funnel, 25.4 grams (0.203 moles) 1,4-dichloro-2-butene was admixed as shown in Example 1. The reactants were stirred without additional heating for a period of about 6½ hours. As in Examples 1 and 2, the desired aqueous solution of the quaternary ammonium salt was obtained by separating the aqueous phase containing the salt from the organic phase containing the impurities and unreacted starting materials by use of a separatory funnel. The aqueous solution of the salt was a viscous light yellow liquid.

EXAMPLE 4

A 1,000 milliliter flask equipped with a stirring bar and a tube to allow continuous purging with oxygen was charged with 340.1 grams (2.64 moles) 2-(N,N-dimethylamino)ethylmethacrylate and 150.0 grams deionized water. While oxygen was bubbled through the solution, 109.9 grams (0.88 moles) of 1,4-dichloro-2-butene was added to the reaction mixture via a dropping funnel over a period of about 2½ hours. The reaction exothermed to approximately 120° F. and was stirred in the presence of oxygen for a period of about six hours. The products were placed in a separatory funnel and the viscous light yellow aqueous layer containing the quaternary ammonium salt was separated off. Stability samples of this methacryloyl unsaturated salt have shown no tendency to polymerize in the absence of actinic radiation when stored for periods of six months or more, but they cure very quickly to give a cross-linked coating with excellent conductivity properties when subjected to electron beam or ultraviolet radiation.

The 75% solid aqueous salt solutions prepared in Examples 1 through 4 were drawn down over commercially available base paper stock, subjected to various levels of radiation and then tested for cure and for surface electrical resistivity (SER). One test for cure is to measure the difference in log SER between the coated side and the uncoated side of the base paper. A summary of these test results is given in Table I.

TABLE I

Effect of Radiation on Curing as Measured by SER* Difference, Front to Back

| Example Number | Average Coat Weight[1] | Log Surface Electrical Resistivity | | | | | | | | |
|---|---|---|---|---|---|---|---|---|---|---|
| | | No Radiation | | | U. V. Cure | | | Electron Beam Cure[3] | | |
| | | Front | Back | Δ | Front | Back | Δ | Front | Back | Δ |
| 1 | 5.86 | 8.32 | 8.43 | 0.11 | 6.89 | 8.00 | 1.11 | — | — | — |
| 2 | 10.55 | 7.59 | 7.70 | 0.11 | 6.59 | 7.05 | 0.46 | — | — | — |
| 3 | 4.66 | 6.97 | 7.89 | 0.92 | 6.46 | 8.59 | 2.13 | 6.80 | 8.55 | 1.75 |
| 4 | 4.95 | 7.43 | 7.89 | 0.46 | 6.92 | 8.66 | 1.74 | — | — | — |
| Commercial Product 1[4] | 4.01 | 9.05 | 9.05 | 0.00 | 7.43 | 8.68 | 1.25 | | | |
| Commercial Product 2[5] | 6.16 | 6.06 | 7.78 | 1.71 | — | — | — | — | — | — |
| Commercial Product 3[6] | 2.61 | 6.51 | 8.38 | 1.87 | — | — | — | — | — | — |
| Uncoated[7] | — | 10.22 | 10.22 | 0 | — | — | — | — | — | — |

*Surface Electrical Resistivity (reciprocal of conductivity)
[1]lbs/3000 ft$^2$
[2]20 ft/min/lamp
[3]40 megarads
[4]DMS Salt of Dimethylaminoethylacrylate (radiation polymerizable into a "linear" conductive polymer)
[5]Conventional conductive agent polyvinylbenzyltrimethylammonium chloride
[6]Conventional quaternary ammonium polymer
[7]Uncoated commercially available base paper As shown in Table I, the low molecular weight, low viscosity coatings described in this invention show only a relatively slight difference in log SER between the front and back sides of the sheet if they have not been subjected to radiation. This is because the low molecular weight materials which have not been crosslinked can soak through the entire paper so that there is essentially no difference in SER between the front side and the back side of the coated sheet. Once the materials of this invention are subjected to high energy by ultraviolet or by electron beam radiation, however, there is a significant increase in the difference in resistivity due to the fact that as the materials crosslink through the acryloyl or methacryloyl unsaturation and become higher molecular weight, they are less able to penetrate the base paper. In this test, the materials of this invention showed a significant difference of between about 0.35 and 1.3 decades of resistivity between the coated and uncoated sides when they were subjected to actinic radiation immediately after application. Table I also shows that the products of this invention have SER values within the range of the currently available commercial products used in photo-imaging applications.

Coated paper samples were also subjected to water extraction tests to determine degree of cure. The coated paper samples were subjected to various levels of radiation, placed in a constant humidity room for two days and then weighed. The coated paper samples were attached to clips to prevent curling and were placed in a beaker of water which was vigorously stirred for five minutes. The samples were returned to the constant humidity room for two days and then reweighed to determine coating loss. A summary of these results is shown in Table II.

TABLE II

Determination of Cure by Water Extraction[1]

| Example Number | Curing Method[2] | Coating Weight[3] | % Coating Weight Lost |
|---|---|---|---|
| 1 | None | 5.04 | 49.9 |
| 1 | U.V. | 5.04 | 26.2 |
| 3 | None | 5.04 | 43.2 |
| 3 | U.V. | 5.04 | 4.3 |
| 3 | E.B. | 5.04 | 5.3 |
| 4 | None | 4.95 | 34.4 |
| 4 | U.V. | 4.95 | 4.2 |
| Commercial Product 1[4] | None | 4.01 | 62.6 |
| Commercial Product 1 | U.V. | 4.01 | 73.3 |
| Commercial Product 2 | None | 8.87 | 79.3 |
| Commercial Product 3 | None | 2.61 | 69.9 |

[1]Gravimetric determination of weight loss after 5 minutes immersion in 25° C. water.
[2]U.V. cures were 20 ft/min/lamp Electron beam cures were at 40 megarads.
[3]lbs/3000 ft.$^2$
[4]Identity of the commercial products is same as given in Table I.

As clearly shown in Table II, the materials of this invention show a significant decrease in the amount of material extractable by water after they have been cured by ultraviolet or electron beam radiation. The current commercial products, however, are still subject to a high degree of water solubility. Even the commercially available DMS salt of dimethylaminoethylacrylate was still very water soluble even after polymerization by U.V. This is because that material is polymerizable only into a linear conductive polymer. The materials of this invention, however, will typically always contain an average of more than one acryloyl or methacryloyl sites per molecule which enables these products to crosslink thereby dramatically decreasing their solubility.

The experimental results outlined in Table I and II also clearly indicate that the materials of this invention have excellent conductivity characteristics as well as excellent cure when subjected to actinic radiation. The cured coatings also remain essentially tack-free even in high relative humidity, apparently due to the high degree of polymerization.

While this invention has been described by a specific number of embodiments, it is obvious that other variations and modifications may be made without departing from the spirit and scope of the invention as set forth in the appended claims.

The invention claimed is:

1. A process for treating a substrate to impart conductive characteristics which comprises:
   (i) applying a radiation crosslinkable coating onto the surface of the substrate; and
   (ii) subjecting the radiation crosslinkable coating to actinic radiation sufficient to cause crosslinking of said coating;
   wherein said coating is an aqueous solution of a quaternary ammonium salt obtained by mixing reactive amounts of:
   (a) at least one tertiary amine of the formula:

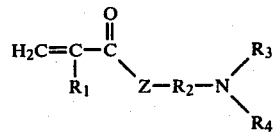

wherein $R_1$ is H or $CH_3$, Z is O or NH, $R_2$ is an aliphatic radical of from 1 to 6 carbon atoms or aryl of from 6 to 10 carbon atoms, $R_3$ and $R_4$ are the same or different and are selected from the group consisting of aliphatic radicals containing from 1 to 10 carbon atoms and aryl radicals containing from 6 to 10 carbon atoms; and
   (b) at least one halide having from 2 to 6 halogen atoms and selected from the group consisting of aliphatic halides having from 1 to 10 carbon atoms and arene halides having from 7 to 20 carbon atoms.

2. The process of claim 1 further characterized in that the actinic radiation has a wavelength less than about 4,000 Angstroms.

3. The process of claim 1 further characterized in that the actinic radiation is electron beam radiation.

4. The process of claim 1 further characterized in that the actinic radiation is ultraviolet radiation.

5. A substrate treated by the process of claim 1.

* * * * *